United States Patent
Chen et al.

(10) Patent No.: US 9,871,136 B2
(45) Date of Patent: Jan. 16, 2018

(54) SEMICONDUCTOR DEVICE

(71) Applicant: UNITED MICROELECTRONICS CORP., Hsin-Chu (TW)

(72) Inventors: Shih-Cheng Chen, Tainan (TW); Tsai-Yu Wen, Tainan (TW); Shan Ye, Kaohsiung (TW); Tsuo-Wen Lu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 33 days.

(21) Appl. No.: 15/206,319

(22) Filed: Jul. 11, 2016

(65) Prior Publication Data

US 2017/0358684 A1 Dec. 14, 2017

(30) Foreign Application Priority Data

Jun. 8, 2016 (TW) .............................. 105118094 A

(51) Int. Cl.
*H01L 29/78* (2006.01)
*H01L 29/51* (2006.01)
*H01L 29/49* (2006.01)
*H01L 29/66* (2006.01)

(52) U.S. Cl.
CPC .... *H01L 29/78391* (2014.09); *H01L 29/4966* (2013.01); *H01L 29/516* (2013.01); *H01L 29/517* (2013.01); *H01L 29/6684* (2013.01)

(58) Field of Classification Search
CPC ........... H01L 29/78391; H01L 29/4966; H01L 29/516
See application file for complete search history.

(56) References Cited

U.S. PATENT DOCUMENTS

| 9,722,093 | B1* | 8/2017 | Xing | .................. H01L 29/7869 |
| 2006/0081901 | A1* | 4/2006 | Arimoto | ................. G11C 11/22 257/295 |
| 2009/0085175 | A1 | 4/2009 | Clark et al. | |
| 2012/0256275 | A1* | 10/2012 | Huang | ............ H01L 21/823842 257/410 |

(Continued)

FOREIGN PATENT DOCUMENTS

| CN | 101047189 A | * | 10/2007 | |
| CN | 100550391 C | | 10/2009 | |
| WO | WO 2017027744 A1 | * | 2/2017 | ....... H01L 21/28291 |

OTHER PUBLICATIONS

Electron work functions of the elements.*

(Continued)

*Primary Examiner* — Tom Thomas
*Assistant Examiner* — Vincent Wall
(74) *Attorney, Agent, or Firm* — Winston Hsu

(57) ABSTRACT

A semiconductor device includes a substrate, an electrode layer disposed on the substrate, and a tri-layered gate-control stack sandwiched between the substrate and the electrode layer. The tri-layered gate-control stack includes a ferroelectric layer disposed on the substrate, a mid-gap metal layer sandwiched between the ferroelectric layer and the substrate, and an anti-ferroelectric layer. The anti-ferroelectric layer is sandwiched between the substrate and the mid-gap metal layer. Alternatively, the ferroelectric layer and the mid-gap metal layer are sandwiched between the anti-ferroelectric layer and the substrate.

17 Claims, 2 Drawing Sheets

(56) References Cited

U.S. PATENT DOCUMENTS

| | | | |
|---|---|---|---|
| 2012/0286342 A1* | 11/2012 | Kamon | H01L 29/93 257/296 |
| 2013/0270619 A1* | 10/2013 | Schloesser | H01L 21/28291 257/295 |
| 2015/0014813 A1 | 1/2015 | Mueller et al. | |
| 2016/0035856 A1* | 2/2016 | van Bentum | H01L 21/28158 257/295 |

OTHER PUBLICATIONS

Khan, et al., "Ferroelectric Negative Capacitance MOSFET: Capacitance Tuning & Antiferroelectric Operation", Electron Devices Meeting (IEDM), 2011 IEEE International Dec. 2011, pp. 11.3.1-11.3.4.*

CN 101047189 A machine translation.*

Huang et al., "Hafnium-based High-K Gate Dielectrics", chaper 16, Advances in Solid State Circuits Technologies, ISBN 978-953-307-086-5.pp. 333-350.*

Asif I. Khan, Ferroelectric Negative Capacitance MOSFET: Capacitance Tuning & Antiferroelectric Operation, 2011.

* cited by examiner

9,871,136 B2

SEMICONDUCTOR DEVICE

BACKGROUND OF THE INVENTION

1. Field of the Invention

The present invention relates to a semiconductor device, and more particularly, to a semiconductor device including ferroelectric (hereinafter abbreviated as FE) material and anti-ferroelectric (hereinafter abbreviated as AFE) material.

2. Description of the Prior Art

A semiconductor device means any device which can function by utilizing semiconductor characteristics, such as an electro-optical device, a semiconductor circuit, and an electronic device. Accordingly, semiconductor devices are used in a variety of electronic applications, such as personal computers, cell phones, digital cameras, and other electronic equipment, as example.

Semiconductor devices are typically fabricated by sequentially depositing insulating or dielectric layer, conductive layers, and semiconductor layers over a semiconductor substrate, and patterning the various material layers using lithography to form circuit components and elements thereon. Since the semiconductor integrated circuit industry has experienced rapid growth and improvement, technological advances in semiconductor materials and design have produced increasingly smaller and more complex circuits. Consequently, the number of interconnected devices per unit of area has increased as the size of the smallest components that can be reliably created has decreased. However, as the size of the smallest components has decreased, numerous challenges have risen. As features become closer, current leakage can become more noticeable, signals can crossover more easily, and power usage has become a significant concern. Typically, when a gate bias of a metal-oxide-semiconductor field effect transistor (hereinafter abbreviated as MOS FET) device is below the threshold voltage $V_{th}$, the current flow between the source and the drain, which is defined as the subthreshold current, is supposed to be zero. Or, the subthreshold current was supposed to be very small and thus in early analytical models of the electrical behavior of MOS FET were even assuming a zero off-state current/subthreshold current. Those skilled in the art should have known there is a linear relationship between the subthreshold current and the gate voltage, which is recognized as subthreshold swing (SS). A small subthreshold swing is highly desired since it improves the ratio between the on and off currents, and therefore reduces leakage currents. Using a device with a small subthreshold swing therefore has advantages such as suppression of power consumption due to reduction in operation voltage and reduction in off leakage current. However, the subthreshold swing cannot be less than 60 mV/sec due to the physical limit of MOS FET device in state-of-the-art. Thus, it is still in need to reduce the subthreshold swing despite the physical limit.

SUMMARY OF THE INVENTION

According to an aspect of the present invention, a semiconductor device is provided. The semiconductor device includes a substrate, an electrode layer disposed on the substrate, and a tri-layered gate-control stack sandwiched between the substrate and the electrode layer. The tri-layered gate-control stack further includes a ferroelectric (FE) layer disposed on the substrate, an anti-ferroelectric (AFE) layer sandwiched between the FE layer and the substrate, and a mid-gap metal layer sandwiched between the FE layer and the AFE layer.

According to another aspect of the present invention, a semiconductor device is provided. The semiconductor device includes a substrate, an electrode layer disposed on the substrate, and a tri-layered gate-control stack sandwiched between the substrate and the electrode layer. The tri-layered gate-control stack further includes an AFE layer disposed on the substrate, a mid-gap metal layer sandwiched between the AFE layer and the substrate, and a FE layer sandwiched between the AFE layer and the mid-gap metal layer.

According to still another aspect of the present invention, a semiconductor device is provided. The semiconductor device includes a substrate, an electrode layer disposed on the substrate, and a tri-layered gate-control stack sandwiched between the substrate and the electrode layer. The tri-layered gate-control stack further includes an amorphous dielectric layer, a mid-gap metal layer disposed between the amorphous dielectric layer and the substrate, and a polycrystalline dielectric layer. The mid-gap metal layer directly contacts the amorphous dielectric layer. And the amorphous dielectric layer and the polycrystalline dielectric layer both include hafnium oxide materials.

According to the semiconductor devices provided by the present invention, the tri-layered gate-control stack is provided between the electrode layer and the substrate, and the tri-layered gate-control stack includes the FE layer, the AFE layer and the mid-gap metal layer. It is noteworthy that in the tri-layered gate-control stack, the mid-gap metal layer is always sandwiched between the FE layer and the substrate while the AFE layer is disposed on or under the dual-layered structure consisting of the FE layer and the mid-gap metal layer. The FE layer is provided to enhance electric fields created by the electrode layer and the mid-gap metal layer is provided to homogenize the enhanced electric fields. Furthermore, the AFE layer is provided to render negative capacitance effect. The tri-layered gate-control stack is therefore used to replace conventional high-k gate dielectric layer according to the present invention, and the semiconductor device provided by the present invention therefore obtains smaller subthreshold swing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
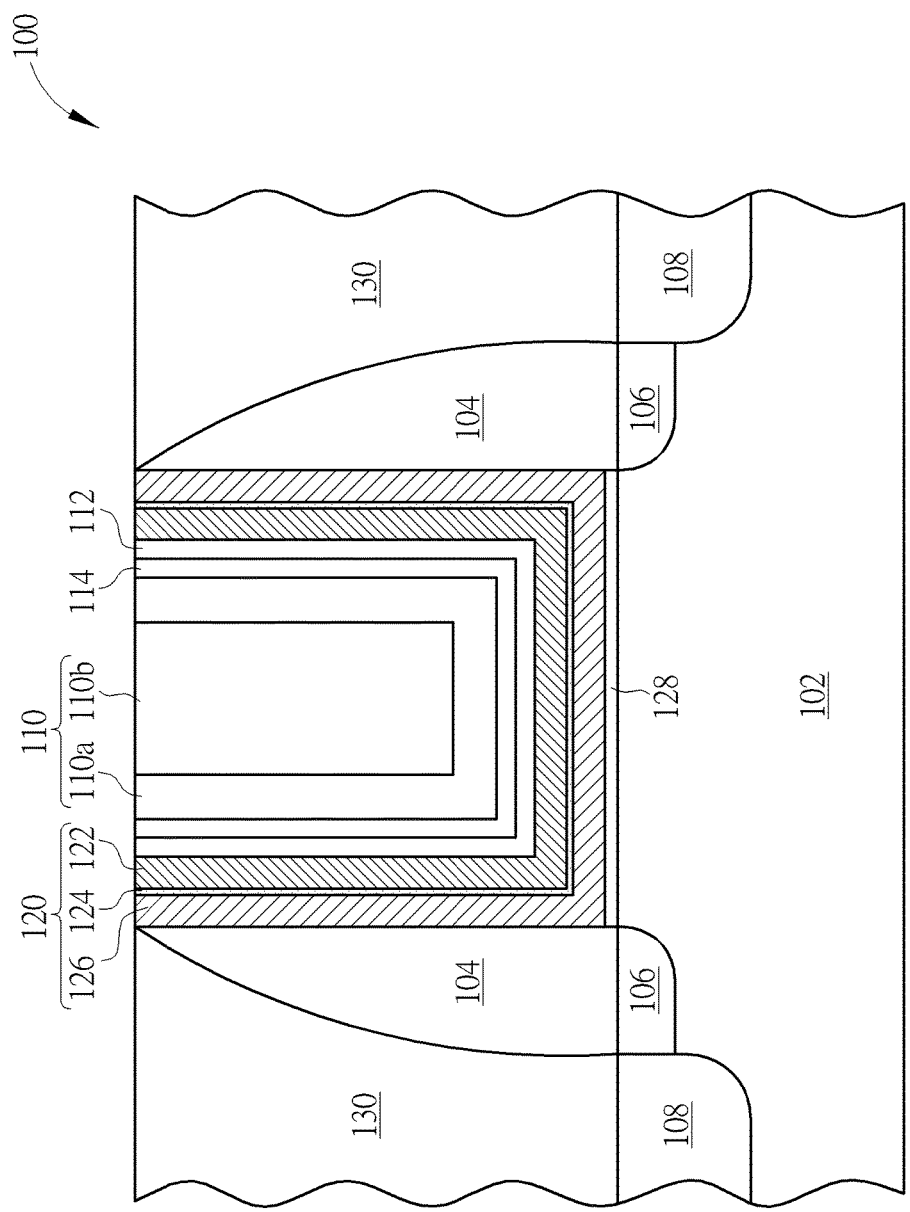
FIG. 1 is a schematic drawing illustrating a semiconductor device provided by a first preferred embodiment of the present invention.

Please refer to FIG. 1, which is a schematic drawing illustrating a semiconductor device provided by a first preferred embodiment of the present invention. As shown in FIG. 1, a semiconductor device 100 is proved by the preferred embodiment, and the semiconductor device 100 includes a substrate 102 such as silicon substrate, silicon-containing substrate, or silicon-on-insulator (hereinafter abbreviated as SOI) substrate. A plurality of isolation structures (not shown) is formed in the substrate 102. The isolation structures can be shallow trench isolations (STIs), but not limited to this. The isolation structures are used to define a plurality of active regions for accommodating p-typed FET (hereinafter abbreviated as pFET) devices and/or n-typed FET (hereinafter abbreviated as nFET) devices, and to provide electrical isolation. In some preferred embodiments of the present invention, a semiconductor layer such as a fin structure involved in fin field effect transistor (FinFET) approach can be provided. The fin structure can be formed by patterning a single crystalline silicon layer of a SOI substrate or a bulk silicon substrate by photolithographic etching pattern (PEP) method, multi patterning method, or, preferably, spacer self-aligned double-patterning (SADP), also known as sidewall image transfer (SIT) method. And the fin structure can be taken as the substrate 102 in the preferred embodiment.

An electrode layer 110 is disposed on the substrate 102. In the preferred embodiment, metal gate approach is integrated. Accordingly, the electrode layer 110 includes at least a work function metal layer 110a, and the work function metal layer 110a includes various metal materials depending on the conductivity type of the semiconductor device 100 to be formed: In some embodiments of the present invention, the semiconductor device 100 is a p-typed semiconductor device, and the work function metal layer 110a includes any suitable metal material having a work function between about 4.8 eV and about 5.2 eV such as titanium nitride (TiN), tantalum nitride (TaN), titanium carbide (TiC), tantalum carbide (TaC), tungsten carbide (WC), or aluminum titanium nitride (TiAlN), but not limited to this. Alternatively, in some embodiments of the present invention, the semiconductor device 100 is an n-typed semiconductor device, and the work function metal layer 110a includes any suitable metal material having a work function between about 3.9 eV and about 4.3 eV, such as titanium aluminide (TiAl), zirconium aluminide (ZrAl), tungsten aluminide (WAl), tantalum aluminide (TaAl), or hafnium aluminide (HfAl), but not limited to this. Additionally, the work function metal layer 110a can be a single-layered structure or a multi-layered structure. The electrode layer 110 further includes a gap-filling metal layer 110b, and the gap-filling metal layer 110b can be a single metal layer or a multiple metal layer including superior gap filing ability, such as Al, Ti, Ta, W, Nb, Mo, Cu, TiN, TiC, TaN, Ti/W, or Ti/TiN, but not limited to this. Furthermore, it is well-known to those skilled in the art that a bottom barrier layer, an etch stop layer, and/or a top barrier layer can be included in the electrode layer 110 if required. As shown in FIG. 1, a bottom barrier layer 112 is sandwiched between the electrode layer 110 and the substrate 100, and an etch stop layer 114 is sandwiched between the electrode layer 110 and the bottom barrier layer 112. Additionally, a top barrier layer (not shown) can be sandwiched between the work function metal layer 110a and the gap-filling metal layer 110b. The etch stop layer 114 preferably includes material including etching rate different from the bottom barrier layer 112. For example but not limited to, the bottom barrier layer 112 can be a TiN layer and the etch stop layer 114 can be a TaN layer.

Please still refer to FIG. 1. The semiconductor device 100 provided by the preferred embodiment further includes a tri-layered gate-control stack 120 sandwiched between the substrate 102 and the electrode layer 110. The tri-layered gate-control stack 120 includes a FE layer 122 disposed on the substrate 102, an AFE layer 126 sandwiched between the FE layer 122 and the substrate 102, and a mid-gap metal layer 124 sandwiched between the FE layer 122 and the AFE layer 126. In some embodiments of the present invention, the FE layer 122 includes a material selected from the group consisting of lead zirconate titanate (bZrTiO$_3$, PZT), lead lanthanum zirconate titanate (PbLa(TiZr)O$_3$, PLZT), strontium bismuth tantalate (SrBiTa$_2$O$_9$, SBT), bismuth lanthanum titanate ((BiLa)$_4$Ti$_3$O$_{12}$, BLT), and barium strontium titanate (BaSrTiO$_3$, BST). The AFE layer 126 includes a material selected from the group consisting of lead indium niobate (Pb(InNb)O$_3$), niobium-sodium oxide (NbNaO$_3$), lead zirconate (ZrPbO$_3$), lead lanthanum zirconate titanate (TiZrLaPbO$_3$), lead zirconate titanate (TiZrPbO$_3$), ammonium dihydrogen phosphate (NH$_4$H$_2$PO$_4$, ADP), and ammonium dihydrogen arsenate (NH$_4$H$_2$AsO$_4$, ADA). It is noteworthy that the FE layer 122 and the AFE layer 126 can include the same elementary material but with different crystalline morphologies and/or composition ratio. For example, both of the FE layer 122 and the AFE layer 126 can include hafnium oxide material such as HfZrOx, but the FE layer 122 includes amorphous HfZrOx while the AFE layer 126 includes polycrystalline HfZrOx. It is noteworthy that hafnium oxide material can still include other elementary material such as Zr in accordance with the present invention. In other words, in some embodiments of the present invention, the FE layer 122 is taken as an amorphous or a fractionally crystalized dielectric layer and the AFE layer 126 is taken as a polycrystalline dielectric layer. The mid-gap metal layer 124 includes metal having a work function between valence band and conduction band. The mid-gap metal layer 124 includes metal nitride such as, for example but not limited to, TiN, TaN, titanium silicon nitride (TiSiN), tantalum silicon nitride (TaSiN), or molybdenum nitride (MoN). In other embodiments of the present invention, the mid-gap metal layer 124 can include nickel silicide (NiSi), tungsten silicide (WSi), cobalt silicide (CoSi$_2$), or titanium tungsten (TiW), but not limited to this.

It is noteworthy that since an antiferromagnetic state will transfer to a paramagnetic state at a temperature over the Neel temperature, high-k last approach is adopted in the preferred embodiments of the present invention in order to avoid the above mentioned issue. It is well-known to those skilled in the art that in the high-k last approach, a dummy gate or a replacement gate (not shown) is formed on the substrate 102 and followed by forming elements of a FET device such as light doped drains (LDDs) 106, a spacer 104, and a source/drain 108. The dummy gate includes a dielectric layer (not shown), a conductive layer such as a poly-silicon layer (not shown), and a patterned hard mask (not shown). The spacer 104 can be a single-layered structure or a multi-layered structure, but not limited to this. Furthermore, selective strain scheme (SSS) can be used in the preferred embodiments of the present invention. For example, a selective epitaxial growth (SEG) method can be used to form the source/drain. When the semiconductor device 100 is the p-typed transistor, epitaxial silicon layers of SiGe are used to form the source/drain. When the semiconductor device 100 is the n-typed transistor, epitaxial silicon layers of SiC or SiP are used to form the source/drain. Additionally, salicides (not shown) can be formed on the source/drain 108. After forming the semiconductor device 100, an etch liner such as a contact etch stop layer (hereinafter abbreviated as CESL) (not shown) is selectively formed on the substrate 100, and an interlayer dielectric (hereinafter abbreviated as ILD) layer 130 is subsequently formed. Next, a planarization process such as chemical mechanical polishing (CMP) process is performed to planarize the ILD layer 130 and the CESL. The patterned hard mask is then removed to expose the conductive layer of the dummy gate and followed by removing the conductive layer and the dielectric layer of the dummy gate. Consequently, a gate trench (not shown) is formed on the substrate 102. In some preferred embodiments of the present invention, an oxide liner 128 can be formed in the gate trench and followed by forming the tri-layered gate-control stack 120 in the gate trench. And after forming the tri-layered gate-control stack 120, the abovementioned metal layers are formed. Accordingly, the tri-layered gate-control stack 120 includes a U shape in the preferred embodiments. The oxide liner 128 serves as an interfacial layer (IL), and the interfacial layer provides a superior interface between the substrate 102 and the tri-layered gate-control stack 120. Additionally, the bottom barrier layer 112 and the etch stop layer 114 are sandwiched between the tri-layered gate-control stack 120 and the electrode layer 110 as shown in FIG. 1. It should be easily understood to those skilled in the art that in still other preferred embodiments of the present invention, high-k first approach can be adopted and thus the tri-layered gate-control stack 120 includes a flap shape in those preferred embodiments.

According to the semiconductor device 100 provided by the preferred embodiment, the tri-layered gate-control stack 120 sandwiched between the electrode layer 110 and the substrate 102 is provided. The FE layer 122 (or, the material layer including the ferroelectric characteristic due to its amorphous or fractionally crystalized morphology, such as the amorphous or fractionally crystalized dielectric layer) of the tri-layered gate-control stack 120 is used to enhance the electric fields created by the electrode layer 110. However, it is found the electric fields enhanced by the FE layer 122 are inhomogeneous. Therefore, the mid-gap metal layer 124 sandwiched between the FE layer 122 and the substrate 102 is provided. The mid-gap metal layer 124 directly contacts the FE layer (the amorphous or fractionally crystalized dielectric layer) and homogenizes the electric fields enhanced by the FE layer 122. Furthermore, the AFE layer 126 (the material layer including anti-ferroelectric characteristic due to its polycrystalline morphology, such as the polycrystalline dielectric layer) is provided to render negative capacitance effect. Consequently, the subthreshold swing is reduced. Compared with the device including the convention high-k gate dielectric layer, the subthreshold swing of the semiconductor device 100 provided by the present invention is significantly reduced from 60 mV/dec to 10 mV/dec, which is beyond the physical limit. And thus both leakage current and power consumption are reduced.

Figure 2:
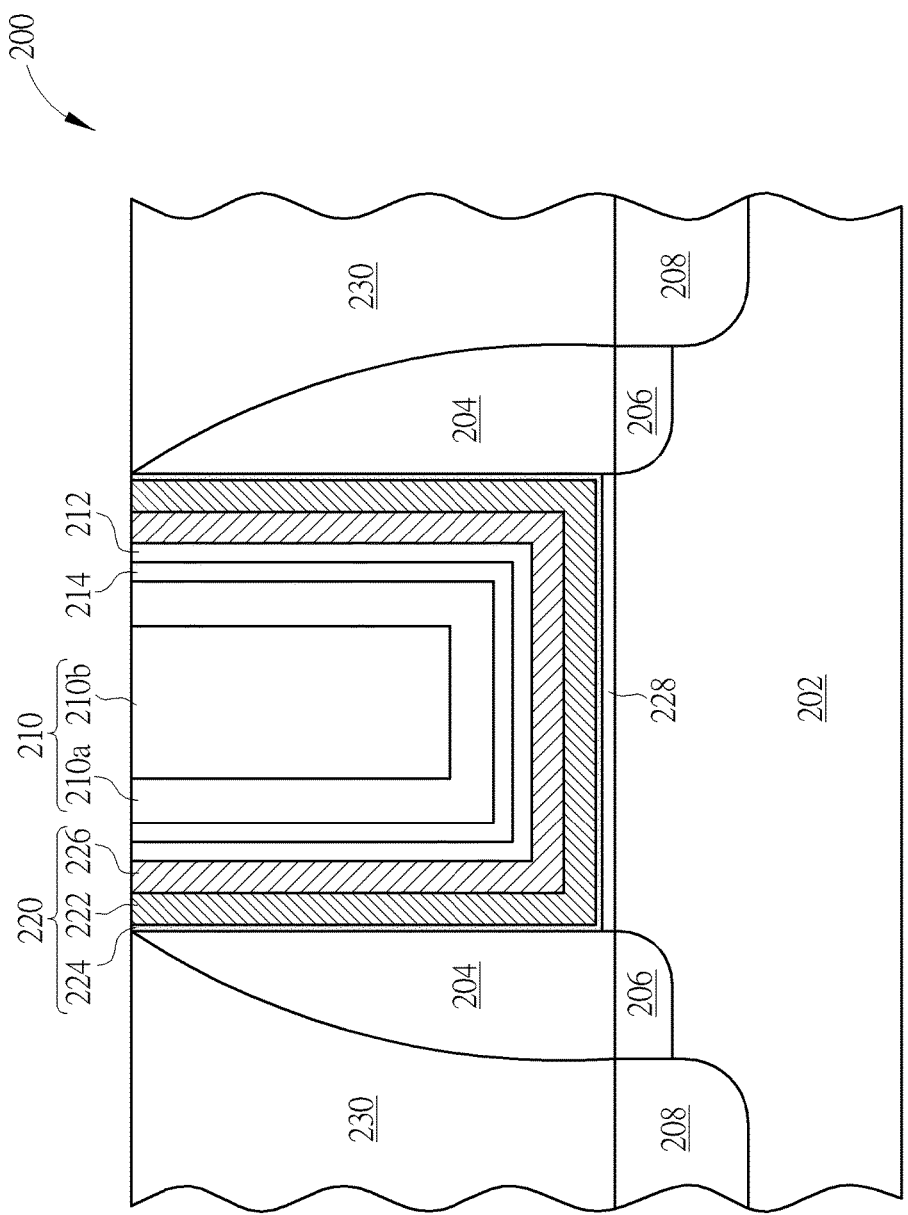
FIG. 2 is a schematic drawing illustrating a semiconductor device provided by a second preferred embodiment of the present invention.

Please refer to FIG. 2, which is a schematic drawing illustrating a semiconductor device provided by a second preferred embodiment of the present invention. It should be noted that elements the same in the first and second preferred embodiments can be formed by the same method with the same material, thus those details are omitted in the interest of brevity. As shown in FIG. 2, a semiconductor device 200 is proved by the preferred embodiment, and the semiconductor device 200 includes a substrate 202. A plurality of isolation structures (not shown) is formed in the substrate 202. The isolation structures are used to define a plurality of active regions for accommodating pFET devices and/or nFET devices, and to provide electrical isolation. Furthermore, a semiconductor layer such as a fin structure involved in FinFET approach can be provided and taken as the substrate 202 in some preferred embodiments of the present invention.

An electrode layer 210 is disposed on the substrate 202. In the preferred embodiment, metal gate approach is integrated. Accordingly, the electrode layer 210 includes at least a work function metal layer 210a, and the work function metal layer 210a includes various metal materials depending on the conductivity type of the semiconductor device 200 to be formed: In some embodiments of the present invention, the semiconductor device 200 is a p-typed semiconductor device, and the work function metal layer 210a includes any suitable metal material having a work function between about 4.8 eV and about 5.2 eV. Alternatively, in some embodiments of the present invention, the semiconductor device 200 is an n-typed semiconductor device, and the work function metal layer 210a includes any suitable metal material having a work function between about 3.9 eV and about 4.3 eV. Additionally, the work function metal layer 210a can be a single-layered structure or a multi-layered structure. The electrode layer 210 further includes a gap-filling metal layer 210b, and the gap-filling metal layer 210b can be a single metal layer or a multiple metal layer including superior gap filing ability. Furthermore, it should be easily understood to those skilled in the art that a bottom barrier layer, an etch stop layer, and/or a top barrier layer can be included in the electrode layer 210 if required. As shown in FIG. 2, a bottom barrier layer 212 is sandwiched between the electrode layer 210 and the substrate 200 while an etch stop layer 214 is sandwiched between the electrode layer 210 and the bottom barrier layer 212. Additionally, a top barrier layer (not shown) can be sandwiched between the work function metal layer 210a and the gap-filling metal layer 210b. And the etch stop layer 214 preferably includes material including etching rate different from the bottom barrier layer 212.

Please still refer to FIG. 2. The semiconductor device 200 provided by the preferred embodiment further includes a tri-layered gate-control stack 220 sandwiched between the substrate 202 and the electrode layer 210. The tri-layered gate-control stack 220 includes an AFE layer 226 disposed on the substrate 202, a mid-gap metal layer 224 sandwiched between the AFE layer 226 and the substrate 202, and a FE layer 222 sandwiched between the AFE layer 226 and the mid-gap metal layer 224. As mentioned above, the FE layer 222 and the AFE layer 226 can include different materials, or the same elementary material but with different crystalline morphologies and/or composition ratio. In other words, the FE layer 222 can be taken an amorphous or a fractionally crystalized dielectric layer while the AFE layer 226 can be taken as a polycrystalline dielectric layer.

As mentioned afore, since an antiferromagnetic state will transfer to a paramagnetic state at a temperature over the Neel temperature, high-k last approach is adopted in preferred embodiments of the present invention in order to avoid the above mentioned issue. It is well-known to those skilled in the art that in the high-k last approach, a dummy gate or a replacement gate (not shown) is formed on the substrate 202 and followed by forming elements of a FET device such as LDDs 206, a spacer 204, and a source/drain 208. And after forming a CESL (not shown) and an ILD layer 230, the dummy gate is removed to form a gate trench (not shown) on the substrate 202. In some preferred embodiments of the present invention, an oxide liner 228 can be formed in the gate trench and followed by forming the tri-layered gate-control stack 220 in the gate trench. And after forming the tri-layered gate-control stack 220, the abovementioned metal layers are formed. Accordingly, the tri-layered gate-control stack 220 includes a U shape in the preferred embodiments. The oxide liner 228 serves as an interfacial layer, and the interfacial layer provides a superior interface between the substrate 202 and the tri-layered gate-control stack 220. Additionally, the bottom barrier layer 212 and the etch stop layer 214 are sandwiched between the tri-layered gate-control stack 220 and the electrode layer 210 as shown in FIG. 2. It should be easily understood to those skilled in the art that in still other preferred embodiments of the present invention, high-k first approach can be adopted and thus the tri-layered gate-control stack 220 includes a flap shape in those preferred embodiments.

According to the semiconductor device 200 provided by the preferred embodiment, the tri-layered gate-control stack 220 sandwiched between the electrode layer 210 and the substrate 202 is provided. The FE layer 222 (or the amorphous or fractionally crystalized dielectric layer) of the tri-layered gate-control stack 220 is used to enhance the electric fields created by the electrode layer 210. However, it is found the electric fields enhanced by the FE layer 222 are inhomogeneous. Therefore, the mid-gap metal layer 224 sandwiched between the FE layer 222 and the substrate 202 is provided. The mid-gap metal layer 224 directly contacts the FE layer (the amorphous or fractionally crystalized dielectric layer) and homogenizes the electric fields enhanced by the FE layer 222. Furthermore, the AFE layer 226 (the polycrystalline dielectric layer) is provided to render negative capacitance effect. Consequently, the subthreshold swing is reduced. Compared with the device including the convention high-k gate dielectric layer, the subthreshold swing of the semiconductor device 200 provided by the present invention is significantly reduced to be lower than 60 mV/dec, which is still beyond the physical limit. And thus both leakage current and power consumption are reduced.

According to the semiconductor devices provided by the present invention, the tri-layered gate-control stack is provided between the electrode layer and the substrate, and the tri-layered gate-control stack includes the FE layer (or the amorphous or fractionally crystalized dielectric layer in some conditions), the AFE layer (or the polycrystalline dielectric layer in some conditions), and the mid-gap metal layer. It is noteworthy that in the tri-layered gate-control stack, the mid-gap metal layer is always sandwiched between the FE layer and the substrate while the AFE layer is disposed on or under the dual-layered structure consisting of the FE layer and the mid-gap metal layer. Preferably, the mid-gap metal layer directly contacts the FE layer. The FE layer is provided to enhance electric fields of the electrode layer and the mid-gap metal layer is provided to homogenize the enhanced electric fields. Furthermore, the AFE layer is provided to render negative capacitance effect. The tri-layered gate-control stack is therefore used to replace conventional high-k gate dielectric layer according to the present invention, and the semiconductor device provided by the present invention obtains smaller subthreshold swing, and thus both leakage current and power consumption are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate;
   an electrode layer disposed on the substrate; and
   a tri-layered gate-control stack sandwiched between the substrate and the electrode layer, the tri-layered gate-control stack comprising:
   a ferroelectric (FE) layer disposed on the substrate;
   an anti-ferroelectric (AFE) layer sandwiched between the ferroelectric layer and the substrate, the FE layer and the AFE layer comprising different materials, wherein the AFE layer comprises a material selected from the group consisting of lead indium niobate ($Pb(InNb)O_3$), niobium-sodium oxide ($NbNaO_3$), lead zirconate ($ZrPbO_3$), lead lanthanum zirconate titanate ($TiZrLaPbO_2$), lead zirconate titanate ($TiZrPbO_3$), ammonium dihydrogen phosphate ($NH_4H_2PO_4$, ADP), and ammonium dihydrogen arsenate ($NH_4H_2AsO_4$, ADA); and
   a mid-gap metal layer sandwiched between the ferroelectric layer and the AFE layer.

2. The semiconductor device according to claim 1, wherein the electrode layer comprises at least a work function metal layer for a p-typed semiconductor device or for an n-typed semiconductor device.

3. The semiconductor device according to claim 1, further comprising an oxide liner layer sandwiched between the AFE layer of the tri-layered gate-control stack and the substrate.

4. The semiconductor device according to claim 1, wherein the ferroelectric layer comprises a material selected from the group consisting of lead zirconate titanate ($PbZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate (($BiLa)_4Ti_3O_{12}$, BLT), and barium strontium titanate ($BaSrTiO_3$, BST).

5. The semiconductor device according to claim 1, wherein the mid-gap metal layer comprises metal nitride.

6. The semiconductor device according to claim 1, further comprising a bottom barrier layer and an etch stop layer sandwiched between the tri-layered gate-control stack and the electrode layer.

7. The semiconductor device according to claim 1, wherein the tri-layered gate-control stack comprises a U shape.

8. A semiconductor device comprising:
   a substrate;
   an electrode layer disposed on the substrate; and
   a tri-layered gate-control stack sandwiched between the substrate and the electrode layer, the tri-layered gate-control stack comprising:
   an amorphous ferroelectric (FE) dielectric layer;
   a mid-gap metal layer disposed between the amorphous ferroelectric dielectric layer and the substrate, the mid-gap metal layer directly contacting the amorphous ferroelectric dielectric layer; and
   a polycrystalline dielectric layer,
   wherein the amorphous ferroelectric dielectric layer and the polycrystalline dielectric layer both comprise hafnium oxide materials.

9. The semiconductor device according to claim 8, wherein the polycrystalline dielectric layer is sandwiched between the mid-gap metal layer and the substrate.

10. The semiconductor device according to claim 8, wherein the electrode layer comprise at least a work function metal layer for a p-typed semiconductor device or for an n-typed semiconductor device.

11. A semiconductor device comprising:
    a substrate;
    an electrode layer disposed on the substrate; and
    a tri-layered gate-control stack sandwiched between the substrate and the electrode layer, the tri-layered gate-control stack comprising:
    a ferroelectric (FE) layer disposed on the substrate, wherein the ferroelectric layer comprises a material selected from the group consisting of lead zirconate titanate ($PbZrTiO_3$, PZT), lead lanthanum zirconate titanate (PbLa(TiZr)O$_3$, PLZT), strontium bismuth tantalate (SrBiTa$_2$O$_9$, SBT), bismuth lanthanum titanate ((BiLa)$_4$Ti$_3$O$_{12}$, BLT), and barium strontium titanate (BaSrTiO$_3$, BST);

an anti-ferroelectric (AFE) layer sandwiched between the ferroelectric layer and the substrate, the FE layer and the AFE layer comprising different materials; and a mid-gap metal layer sandwiched between the ferroelectric layer and the AFE layer.

12. The semiconductor device according to claim 11, wherein the electrode layer comprises at least a work function metal layer for a p-typed semiconductor device or for an n-typed semiconductor device.

13. The semiconductor device according to claim 11, further comprising an oxide liner layer sandwiched between the AFE layer of the tri-layered gate-control stack and the substrate.

14. The semiconductor device according to claim 11, wherein the mid-gap metal layer comprises metal nitride.

15. The semiconductor device according to claim 11, wherein the AFE layer comprises a material selected from the group consisting of lead indium niobate (Pb(InNb)O$_3$), niobium-sodium oxide (NbNaO$_3$), lead zirconate (ZrPbO$_3$), lead lanthanum zirconate titanate (TiZrLaPbO$_3$), lead zirconate titanate (TiZrPbO$_3$), ammonium dihydrogen phosphate (NH$_4$H$_2$PO$_4$, ADP), and ammonium dihydrogen arsenate (NH$_4$H$_2$AsO$_4$, ADA).

16. The semiconductor device according to claim 11, further comprising a bottom barrier layer and an etch stop layer sandwiched between the tri-layered gate-control stack and the electrode layer.

17. The semiconductor device according to claim 11, wherein the tri-layered gate-control stack comprises a U shape.

\* \* \* \* \*